(12) United States Patent
You et al.

(10) Patent No.: US 6,913,979 B2
(45) Date of Patent: Jul. 5, 2005

(54) METHOD OF MANUFACTURING A METAL OXIDE SEMICONDUCTOR TRANSISTOR

(75) Inventors: Young-Sub You, Gyeonggi-do (KR); Hyeon-Deok Lee, Seoul (KR); Tae-Soo Park, Gyeonggi-do (KR); Heon-Heoung Leam, Seoul (KR); Bong-Hyun Kim, Incheon (KR); Yong-Woo Hyung, Kyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/427,164

(22) Filed: Apr. 30, 2003

(65) Prior Publication Data
US 2004/0058556 A1 Mar. 25, 2004

(30) Foreign Application Priority Data
Sep. 24, 2002 (KR) .............................. 10-2002-0057765

(51) Int. Cl.[7] .......................................... H01L 21/336
(52) U.S. Cl. ...................... 438/301; 438/232; 438/531; 438/762
(58) Field of Search .................. 438/301, 232, 438/531, 762, 945, 241, 231, 302, 279, 303, 305, 238, 737, 701, 275, 283, 304, 696, 911, 920, 185

(56) References Cited
U.S. PATENT DOCUMENTS

| | | | | |
|---|---|---|---|---|
| 4,744,859 A | * | 5/1988 | Hu et al. ..................... | 438/303 |
| 5,234,850 A | * | 8/1993 | Liao ............................. | 438/231 |
| 5,576,228 A | * | 11/1996 | Chen et al. ................. | 438/302 |
| 5,935,875 A | * | 8/1999 | Lee ............................. | 438/737 |
| 5,969,395 A | * | 10/1999 | Lee ............................. | 257/408 |
| 6,087,236 A | * | 7/2000 | Chau et al. ................. | 438/301 |
| 6,251,729 B1 | * | 6/2001 | Montree et al. ............ | 438/257 |
| 6,511,539 B1 | * | 1/2003 | Raaijmakers ............... | 117/102 |
| 6,638,879 B2 | * | 10/2003 | Hsieh et al. ................ | 438/791 |
| 6,707,120 B1 | * | 3/2004 | Aminzadeh et al. ........ | 257/411 |

* cited by examiner

*Primary Examiner*—George Fourson
*Assistant Examiner*—Julio J. Maldonado
(74) *Attorney, Agent, or Firm*—Marger Johnson & McCollom, P.C.

(57) ABSTRACT

Disclosed is a method of manufacturing a MOS transistor having an enhanced reliability. A passivation layer is formed on a gate electrode and on a substrate to prevent a generation of a recess on the substrate. After a mask pattern is formed on the substrate for masking a portion of the substrate, impurities are implanted into an exposed portion of the substrate to form source and drain regions. The substrate is rinsed so that the passivation layer or a recess-prevention layer is substantially entirely or partially removed while the mask pattern is substantially completely removed, thereby forming the MOS transistor. Therefore, the generation of the recess in the source and drain region of the substrate can be prevented due to the passivation layer during rinsing of the substrate.

34 Claims, 9 Drawing Sheets

METHOD OF MANUFACTURING A METAL OXIDE SEMICONDUCTOR TRANSISTOR

BACKGROUND OF THE INVENTION

1. Field of the Invention

The present invention relates to a method of manufacturing a metal oxide semiconductor (MOS) transistor, and more particularly, to a method of manufacturing a transistor having improved reliability.

2. Description of the Related Art

Semiconductor devices have been rapidly developed for wide use in information processing devices such as computers. Therefore, these semiconductor devices are required to have a large storage capacity and a high operational speed. To meet market demands, semiconductor technology has been developed so that leading edge semiconductor devices have high integration density, good reliability and high response speed.

Semiconductor devices are typically categorized as memory devices and non-memory devices. The memory devices include a random access memory (RAM) and a read only memory (ROM) device. A RAM device, such as a dynamic random access memory (DRAM) or a static random access memory (SRAM), has a rapid data input and output speed. However, the RAM device is volatile because the data stored in its memory can dissipate with the passage of time. On the other hand, an ROM device, including a logic device maintains the data stored therein. However, the ROM device has a slower data input and output speed.

Semiconductor devices generally includes at least one transistor in a given cell region. Each cell region of the semiconductor device operates in accordance with the operational characteristics of each transistor located in that cell region. Accordingly, the operational characteristics of the transistor becomes more important in the design of the semiconductor device. Also, the reliability of the semiconductor device depends upon whether or not the transistor sufficiently meets its design specifications. As the semiconductor devices become more highly integrated, the size of the transistors employed is greatly reduced. Moreover, unexpected failures may occur during the fabrication of the transistor due to the size reduction efforts by the manufacturer. Such failures may have fatal effects on the reliability of the semiconductor.

Referring to FIGS. 1A and 1C, which illustrates a conventional method of producing a transistor device, after a semiconductor substrate 10 is divided into an active region and a field region, 10a several gate structures 16 are formed on the semiconductor substrate 10. Each of the gate structures 16 includes a gate oxide film pattern 12 and a polysilicon pattern 14.

A re-oxidation film 18 is formed to a uniform thickness on the gate structures 16 and on the substrate 10 to cure damage to the gate structures 16 and the substrate 10 generated during the formation of the gate structures 16.

Referring to FIG. 1B, a mask pattern 20 is formed on the substrate 10 so that the mask pattern 20 exposes a portion of the substrate 10 where a transistor is formed. The mask pattern 20 is generally formed using a photoresist.

Then, impurities 24 are implanted at a low concentration into a portion of the substrate 10 as shown using the mask pattern 20 and the gate structures 16 as ion implanting masks. Here, the depth ($D_1$) to which the impurities 24 are implanted into the substrate 10, measured from the surface of the substrate 10 to the full extent of the implanted impurities, is approximately 100 to 500 Å. The region where the impurities 24 are implanted then becomes a source or a drain region 22 of the transistor.

Referring to FIG. 1C, a rinsing process is executed for rinsing the remaining substrate 10 and for removing the mask pattern 20. When the rinsing process is performed with respect to the substrate 10. A portion of the substrate 10 may also be etched to a predetermined thickness, thereby forming a recess 26 in the substrate 10. As the recess 26 is generated in the substrate 10, the depth ($D_2$) of the source or the drain region 22a correspondingly decreases. More specifically, the reduction of the depth ($D_2$) of the source or the drain region 22a caused by the formation of the recess 26 seriously effects the more shallow depth of the region where the impurities are implanted, with a corresponding reduction in the length of the gate for purposes of complying with a reduction in the design rule. When the depth ($D_2$) of the source or the drain region 22a is decreased due to the recess 26 on the substrate 10, the impurity concentration in the source or the drain region 22a can also be reduced, thereby increasing the electrical resistance of the transistor. In addition, because the reduction of the depth ($D_2$) of the source or the drain region 22a may not be uniform throughout the entire surface of the substrate 10, excessive deviations between respective transistors formed on the substrate may occur.

To prevent the generation of recess 26 on the substrate 10, a thickness of the re-oxidation film 18 may be increased as shown in FIG. 2. However, unwanted bird beaks (A) may be generated at both end portions of the gate structure 16 during the formation of the re-oxidation film 18 having a thickness thick. When the thickness of the gate oxide film pattern 12 is increased in accordance with the bird beaks (A), the threshold voltage of the transistor may increase due to the increase in the thickness of the gate oxide film pattern 12. The re-oxidation film 18 cannot be further thickened because that in turn will make the bird beaks (A) thicker.

SUMMARY OF THE INVENTION

The present invention has been made to solve the aforementioned problems and accordingly, it is an object of the present invention to provide a method of manufacturing a metal oxide semiconductor transistor having an enhanced reliability In order to achieve the object of the present invention, there is provided a method of forming a metal oxide semiconductor transistor as follows. A gate electrode is formed on a substrate. The gate electrode includes a gate insulation pattern and a conductive pattern. A passivation layer is formed for preventing a generation of a recess on the substrate during rinsing the substrate. The passivation layer is formed on the gate electrode and on the substrate. After forming a mask pattern for masking a portion of the substrate where the passivation layer is formed, source and drain regions are formed via implanting impurity ions into an exposed portion of the substrate including the mask pattern formed thereon. Rinsing the substrate entirely or partially removes the passivation layer while the mask pattern is completely removed.

Also, to achieve the object of the present invention, there is provided a method of forming a metal oxide semiconductor transistor as follows. Gate electrodes are formed on a substrate. Each of the gate electrodes includes a gate insulation pattern and a conductive pattern. After forming a passivation layer for preventing a generation of a recess on the substrate during rinsing the substrate wherein the passivation layer is formed on the gate electrodes and on the substrate, a first mask pattern is formed on the substrate wherein the first mask pattern selectively opens a first region of the substrate and masks a rest portion of the substrate including the passivation layer formed thereon. First impurities are primarily implanted into an exposed portion in the first region of the substrate and the substrate is primarily rinsed so that the passivation layer remains on the substrate by a predetermined thickness while the first mask pattern is completely removed. After forming a second mask pattern on the substrate wherein the second mask pattern selectively opens a second region of the substrate and masks a rest portion of the substrate including the passivation layer formed thereon, second impurities are primarily implanted into an exposed portion in the second region of the substrate. The substrate is secondarily rinsed so that the passivation layer partially or entirely remains on the substrate while the second mask pattern is completely removed. After forming a silicon oxide film on the gate electrodes and on the substrate, nitride spacers are formed on sidewalls of the gate electrodes where the silicon oxide film is formed. After secondarily and selectively implanting the first impurities into the first region of the substrate, the second impurities are secondarily and selectively implanted into the second region of the substrate.

According to the present invention, after a passivation layer is formed on a substrate in order to prevent a generation of a recess on the substrate, an ion implantation process and a rinsing process are performed. Therefore, the generation of the recess on the substrate can be prevented.

BRIEF DESCRIPTION OF THE DRAWINGS

The above and other objects and advantages of the present invention will become readily apparent by reference to the following detailed description when considered in conjunction with the accompanying drawings wherein.

DETAILED DESCRIPTION OF THE PREFERRED EMBODIMENTS

Figure 1A:
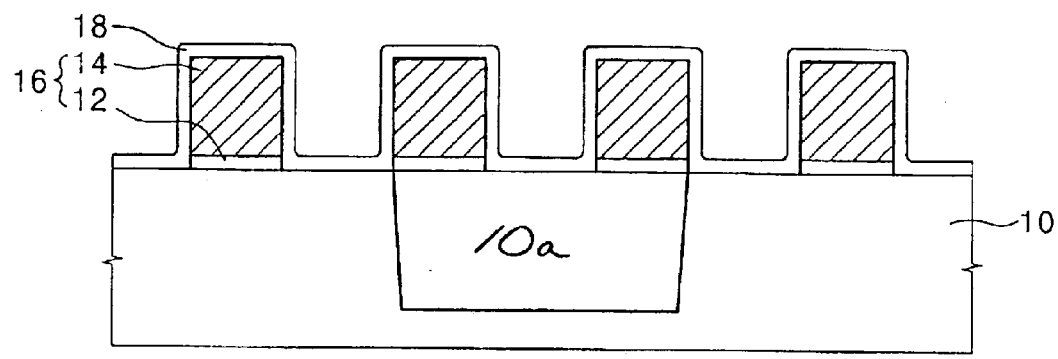
FIGS. 1A to 1C are cross-sectional views illustrating a conventional method of manufacturing a transistor.
Figure 1B:
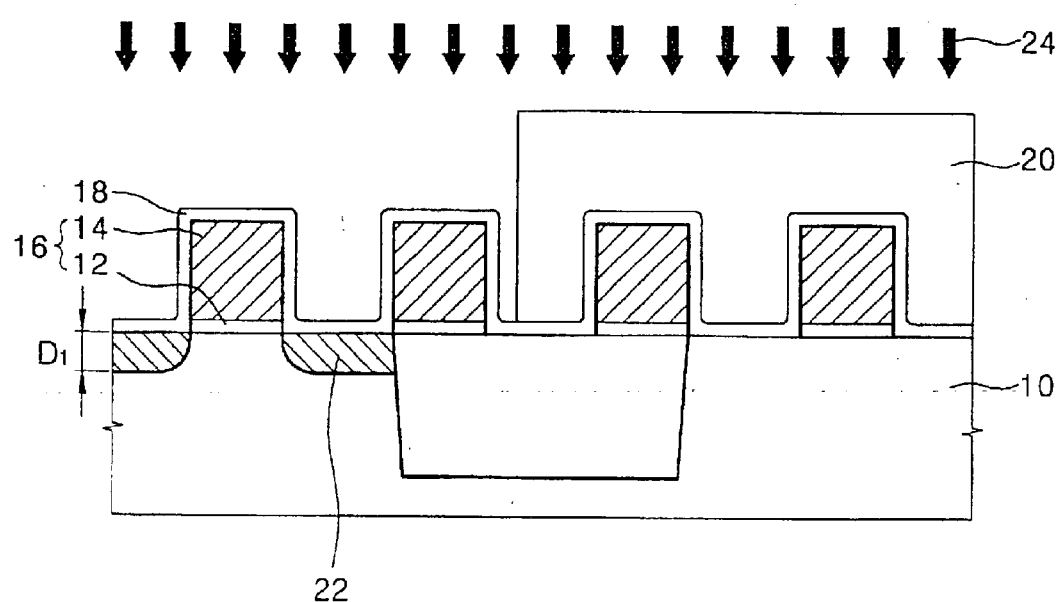
Figure 1C:
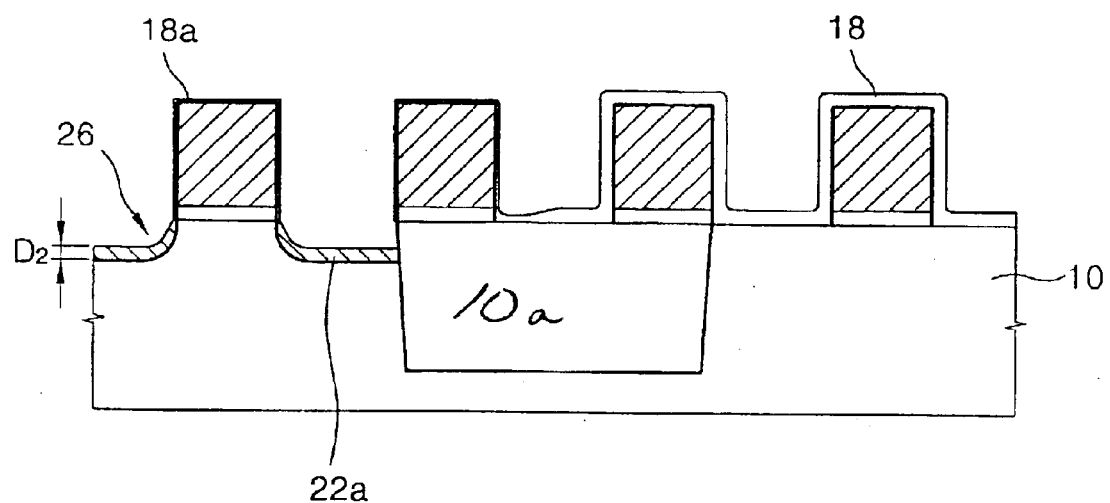
Figure 2:
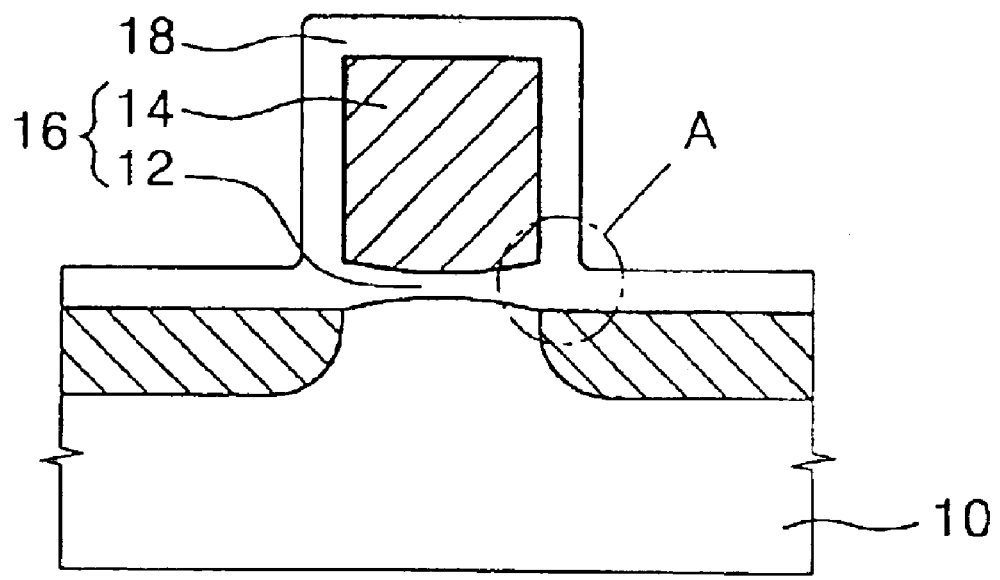
FIG. 2 is a cross-sectional view illustrating a transistor fabricated according to the conventional method.

Hereinafter, the preferred embodiment of the present invention will be described in detail with reference to the accompanying drawings. In the following drawings, the same reference numerals denote the same elements.

Figure 3A:
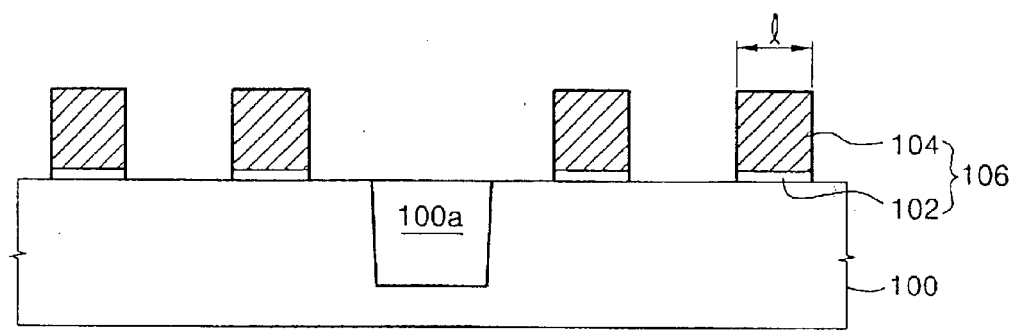
FIGS. 3A to 3K are cross-sectional views illustrating a method of manufacturing a transistor according to a preferred embodiment of the present invention.

Referring to FIG. 3A, a field oxide film 100a is formed on a semiconductor substrate 100 such to define an active region and a field region. The field oxide film 100a is formed through an isolation process such as an improved local oxidation of silicon (LOCOS) process or a trench isolation process.

After a gate dielectric film is formed on the semiconductor substrate 100, a conductive film is formed on the gate oxide film to serve as a gate electrode. The gate oxide film has a thickness of about 30 to 100 Å. The conductive film is formed using polysilicon highly doped with impurities through a doping process, for example, a diffusion process, an ion implantation process or an in-situ doping process. Though it is not shown in FIGS. 3A–3K, the conductive film may include a composite film having a polysilicon film and a metal silicide film or a composite film having a polysilicon film and a metal film. Additionally, a silicon nitride layer (not shown) may be formed on the conductive film to serve as a capping layer.

Hereinafter, the conductive film as described herein includes polysilicon only.

Portions of the conductive film and the gate oxide film are can be successively etched so that gate structures 106 having gate dielectric patterns 102 and conductive patterns 104 are formed. In this case, the lengths (f) of the gate structures 106 may be varied in accordance with the characteristics and the types of transistors to be employed in the gate structures 106.

Figure 3B:
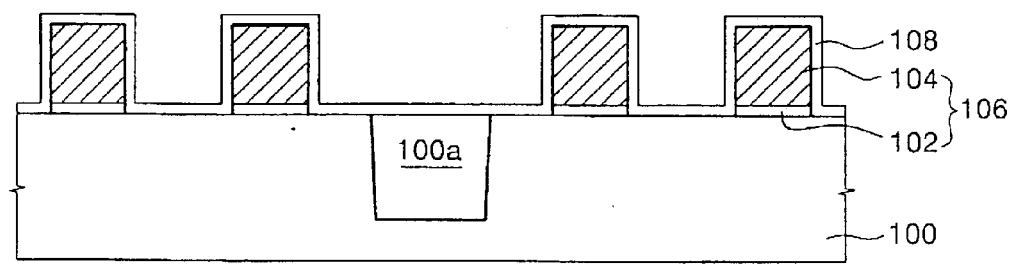

Referring to FIG. 3B, a re-oxidation process is performed with respect to the semiconductor substrate 100 on which the gate structures 106 are positioned such that a re-oxidation film 108 is formed on both the gate structures 106 and on the semiconductor substrate 100, respectively.

By performing the re-oxidation process, surface damage to the substrate 100 and the gate structures 106 can be cured such as in case of surface damage caused during the formation of gate structures 106 by etching the conductive film and the gate oxide film and using ions with high energy. For example, the semiconductor substrate 100 having the gate structures 106 formed thereon can be thermally treated under an oxidation atmosphere thereby curing the surfaces of the gate structures 106 and the semiconductor substrate 100.

The re-oxidation film 108 can include at least one of a silicon oxide film and a metal oxide film. Particularly, examples of the silicon oxide film include high temperature oxide films (HTO) and middle temperature oxide films (MTO). Examples of metal oxide films include aluminum oxide films ($Al_2O_3$) and tantalum oxide films ($Ta_2O_5$). In general, the re-oxidation film 108 may be a silicon oxide film formed by a simple oxidation process.

In the semiconductor device including the gate having the minute length of approximately below 0.2 μm, the re-oxidation film 108 is preferably formed to have a thickness of about 5 to 50 Å. Preferably, the re-oxidation film 108 has a thickness of about 20 Å. When the re-oxidation film 108 has an exceedingly thin thickness, the semiconductor substrate 100 may not be cured since the time for the formation of the re-oxidation film 108 is too short. On the other hand, when the re-oxidation film 108 has a particularly high level of thickness, the thickness of the gate oxide pattern 102 can increase because of the birds beaks formed at both end portions of the gate oxide pattern 102. These bird beaks exert an adverse influence on the thickness of the gate oxide pattern 102 as the lengths of the gate structures 106 are reduced.

The re-oxidation process for forming the re-oxidation film 108 on the gate structures 106 and the substrate 100 will be described as follows:

The semiconductor substrate 100 including the gate structures 106 formed thereon is introduced into a reaction chamber which is maintained at a high temperature. An oxygen gas is introduced into the reaction chamber to serve as an oxidizing agent. At that time, the reaction chamber has a temperature of approximately 600 to 1,000° C. and a pressure of approximately 20 to 760 Torr. The oxygen gas is reacted with the silicon in the surfaces of the gate structures 106 and the substrate 100, and then a silicon oxide film is formed on the gate structures 106 and on the semiconductor substrate 100. However, the above-mentioned re-oxidation process may be omitted depending on the conditions of the individual semiconductor device formation.

Figure 3C:
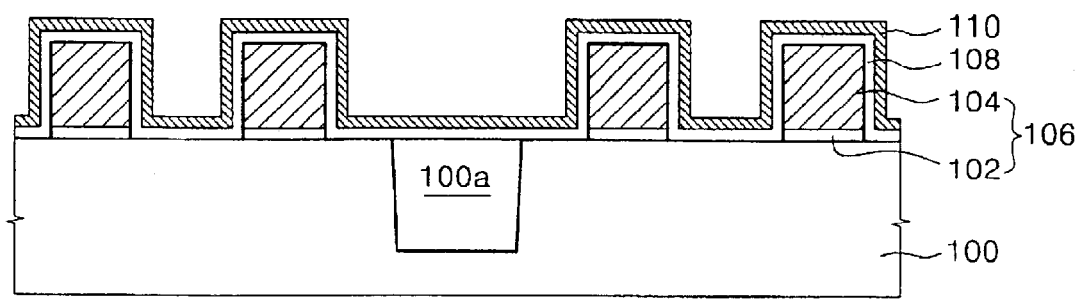

Referring to FIG. 3C, a passivation layer 110 is formed on the re-oxidation film 108 under which the gate structures 106 and the substrate 100 are positioned in order to prevent the formation of a recess on the substrate 100 during the subsequent rinsing process regarding the substrate 100. The passivation layer 110 preferably includes an insulation layer having an etching rate with respect to the rinsing solution employed during the rinsing the substrate of below about 1 Å/m for the substrate 100. The passivation layer 110 can include a silicon nitride layer or a metal oxide layer. In particular, the passivation layer 110 includes a silicon nitride ($Si_3N_4$) layer, an aluminum oxide ($Al_2O_3$) layer or a tantalum oxide ($Ta_2O_5$) layer. The passivation layer 110 is thin and preferably has a thickness of less than about 50 Å, more preferably not more than about 10 Å.

In a subsequent process, impurity ions are implanted into the substrate 100 on which the re-oxidation film 108 and the passivation layer 110 are formed. When the passivation layer 110 has a considerable thickness, the impurity ions may not be fully implanted into the substrate 100. Hence, the passivation layer 110 is preferably formed via an atomic layer deposition (ALD) process in order to form a passivation layer 110 having a relatively thin thickness. In the ALD process, a film can be formed on a stepped profile such that the film has a very thin thickness. In addition, the ALD process is performed at a relatively low temperature of about 350 to 600° C., thereby minimizing the thermal effect (thermal budgets) the substrate 100 or the films formed on the substrate 100.

Hereinafter, a method of forming passivation layer 110, such as a silicon nitride layer, using the ALD process will be described as follows:

A first reaction gas such as dichlorosilane (DCS; $SiCl_2H_2$) or trisdimethylaminosilane ($HSi[N(CH_3)_2]_3$) can be used for the formation of the silicon nitride layer. Additionally, an ammonia ($NH_3$) gas or an activated ammonia gas can be used as a second reaction gas for forming the silicon nitride layer. The silicon nitride film is deposited at a temperature of approximately 360 to 600° C.

Initially, the first reaction gas is introduced into a chamber at the flow rate of approximately 500 sccm for about 30 seconds in the chamber maintained with a pressure of approximately several Torr and a temperature of approximately 500° C. Subsequently, the first reaction gas is purged from the chamber. After the second reaction gas is introduced into the chamber at a flow rate of approximately 2,000 sccm for about 30 seconds in the chamber. Then, the second reaction gas is also purged from the chamber. The silicon nitride layer having a desired thickness can be formed when the above-mentioned process is repeatedly executed.

Subsequently, a process for forming an N-typed transistor or a P-typed transistor is performed regarding the gate structures 106. In general, the N-typed transistors are formed together with the P-typed transistors in the semiconductor device in accordance with the construction of the circuit. The N-typed or the P-typed transistors can be formed to have different characteristics. For example the threshold voltage in different regions of the semiconductor substrate will be in accordance with the construction of the circuit.

Hereinafter, a method of forming the N-typed and the P-typed transistors having the lightly doped drain (LDD) structures on one semiconductor substrate will be described below.

Figure 3D:
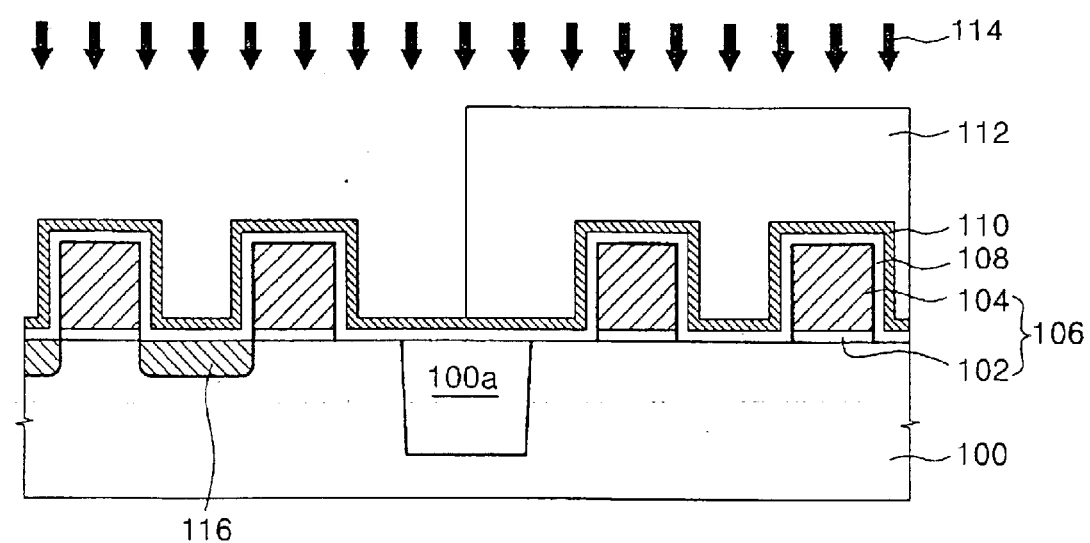

Referring now FIG. 3D, a first mask pattern 112 selectively exposes a portion of a substrate 100 where the N-typed transistor is formed while the passivation layer 110 is formed over the substrate 100. The first mask pattern 112 is formed through exposing and developing a photoresist film after coating the photoresist film on the substrate 100.

Then, an N-typed well having a low concentration is formed on the substrate 100 via implanting impurity ions 114 in Group V of the Periodic Table, such as phosphorus (P) or arsenic (As), into the substrate 100 at a low energy level. In this case, the depth of the implanted impurity ions 114 in Group V is about 100 to 500 Å. For instance, arsenic ions can be implanted into the substrate 100 at a dose of approximately $3 \times 10^{15}$ cm$^{-2}$ with an energy of approximately 3 KeV when the N-typed transistor is formed in a cell region of the substrate 100. Due to the implantation of the impurity ions 114, an N-typed region 116 of the source/drain region is formed at the portion of the substrate 100 between the gate structures 106.

Figure 3E:
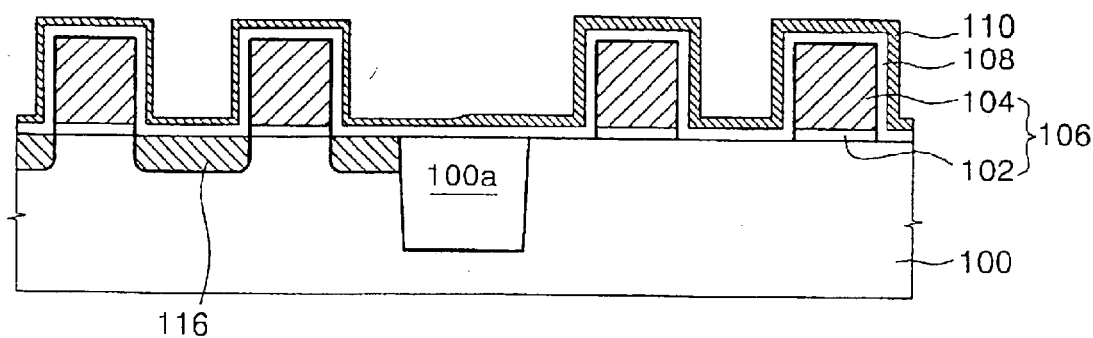

Referring to FIG. 3E, a first rinsing process is executed to remove the first mask pattern 112. The first rinsing process is performed using the rinsing solution that removes the photoresist which forms the first mask pattern 112. For example, the rinsing solution can include sulfuric acid, a mixture of ammonia and hydrogen peroxide or a mixture of sulfuric acid, ammonia and hydrogen peroxide.

After the first rinsing process, the passivation layer 110 remains on the substrate 100 at a predetermined thickness. If the passivation layer 110 is completely removed, the surface of the substrate 100 may be damaged during the subsequent rinsing process using the above-mentioned rinsing solution.

To completely remove the first mask pattern 112 formed on the substrate 100, the substrate 100 is treated with the rinsing solution for a period of time sufficient to remove first mask pattern 112. However, the thin passivation layer 110 may not be completely removed during the rinsing process performed for an extended period of time. The passivation layer 110 formed on the substrate 100 has a preferred thickness of less than about 50 Å, more preferably up to about 10 Å as described above. Thus, the passivation layer 110 advantageously has a slow etching rate with respect to the rinsing solution. Particularly, the passivation layer 110 includes the insulation layer having an etching rate, with respect to rinsing solution, of less than about 1 Å/minute.

Figure 3F:
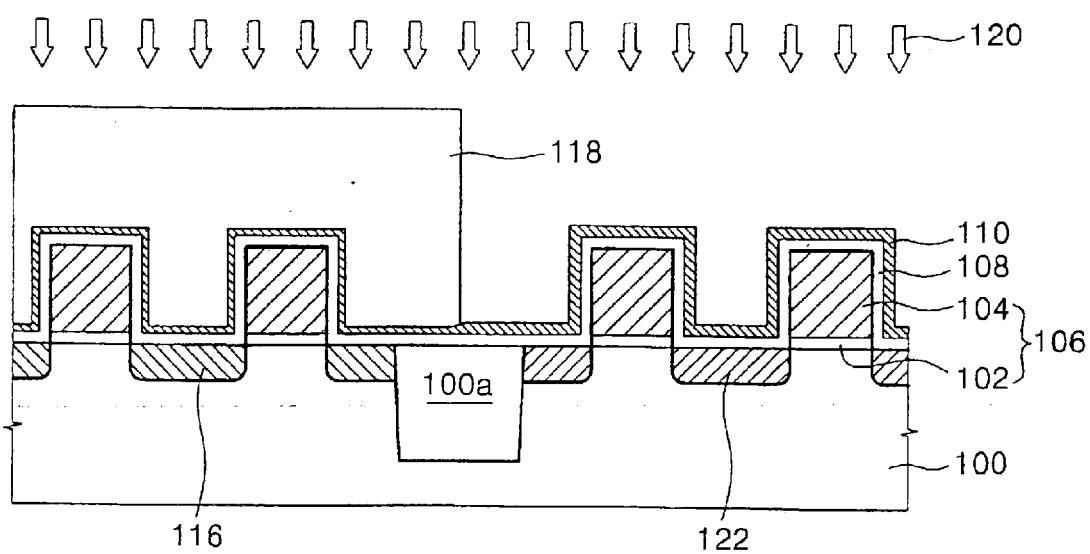

Referring to FIG. 3F, a second mask pattern 118 is formed over a portion of the substrate 100, including the passivation layer 110, to selectively expose the portion of the substrate 100 where the P-typed transistor is formed. The second mask pattern 118 includes a photoresist.

Then, a P-typed well having a low concentration is formed on the substrate 100 where the second mask pattern 118 is positioned using impurity ions 120 included in Group III of the Periodic Table such as boron (B) or gallium (Ga) at a low energy rate. At that time, the impurity ions 120 of Group III are implanted into the substrate 100 to have a depth of about 100 to 500 Å. Particularly, boron ions are implanted into the substrate 100 at an energy of approximately 0.5 KeV when the P-typed transistor is formed in the cell region of the substrate 100. When the impurity ions 120 are implanted into the substrate 100, a P-typed region 122 of the source/drain region is formed in the portion of the substrate 100 between the gate structures 106.

Figure 3G:
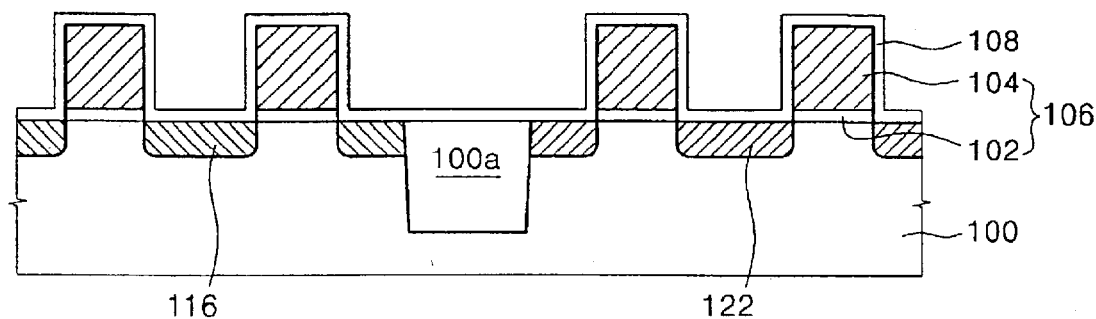

Referring to FIG. 3G, a second rinsing process is performed to remove the second mask pattern 118. The second rinsing process is performed with respect to the substrate 100 with the rinsing solution for removing the photoresist which forms the second mask pattern 118. For example, the rinsing solution can include sulfuric acid, a mixture of ammonia and hydrogen peroxide or a mixture of sulfuric acid, ammonia and hydrogen peroxide. When an ion implantation process is subsequently preformed after the second rinsing process is completed, the passivation layer 110 remains on the substrate 100 at a predetermined thickness. On the other hand, the passivation layer 110 can be completely removed from the substrate 100 if the ion implantation process is not performed after the second rinsing process. According to an embodiment of the present invention as shown in FIG. 3G, the passivation layer 110 is removed from the substrate 100 during the second rinsing process because the ion implantation process is not executed after the second rinsing process. But, the re-oxidation film 108 remains on the substrate 100.

The processes described in FIGS. 3D and 3E may be executed after the processes described in FIGS. 3F to 3G are already or previously performed. Also, the rinsing process and the process for implanting the ions of Group III or V may be additionally performed more than once in order to form the N-typed and the P-typed transistors having different characteristics in different regions of the semiconductor substrate 100.

When the ion implantation process is executed, the atomic bonds of the silicon in the substrate 100 may be broken due to the collision energy of the ions. As a result, the portion of the substrate 100 where the ions are injected may be rapidly etched by the rinsing solution during the rinsing process.

Because the rinsing processes for removing the mask patterns are repeatedly performed on the substrate 100, such as by using ion implantation processes, significant recesses are generated in the regions of the substrate 100 where the impurity ions are implanted since these portions of the substrate 100 are more deeply etched.

The passivation layer 110 also is impacted by the impurity ions colliding thereinto. However, the passivation layer 110 has a slow etching rate relative to the rinsing solution even though the ion implantation process can be employed. Hence, the passivation layer 110 having the predetermined thickness remains on the substrate 100 before the rinsing process is performed. In this way, the formation of recesses in the ion-implanted regions, generated due to the etching of the substrate 100 by the rinsing solution, can be prevented because the passivation layer 110 remains on the substrate 100 during the rinsing processes.

Figure 3H:
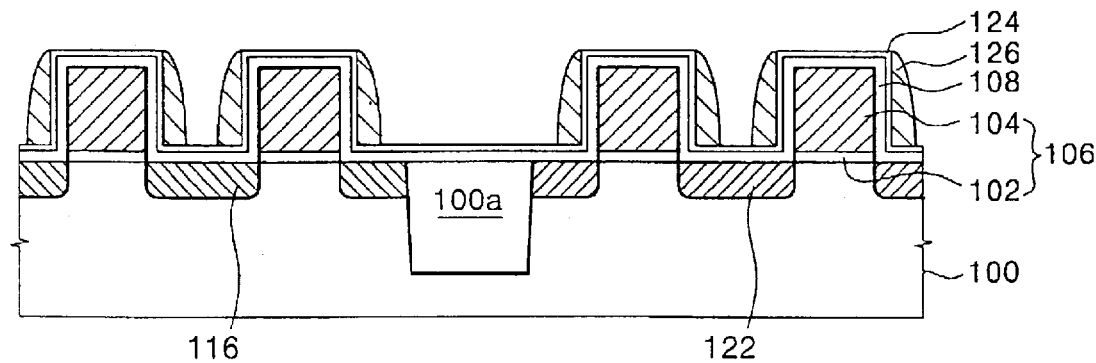

Referring to FIG. 3H, for example, a silicon oxide film 124 having a thickness of approximately 100 Å is formed on sidewalls and upper faces of the gate structures 106 and on the substrate 100. The silicon oxide film 124 can include MTO. Particularly, the silicon oxide film 124 can be formed by introducing the substrate 100 into a deposition furnace having the temperature of about 700 to 800° C. and the pressure of approximately 0.5 to 1.0 Torr.

After a silicon nitride film is formed on the silicon oxide film 124 to a thickness of about 400 to 800 Å, the silicon nitride film is anisotropically etched to form nitride spacers 126 on the sidewalls of the gate structures 106, respectively. The silicon oxide film 124 has the dielectric constant relatively lower than that of the silicon nitride film. Thus, when the nitride spacers 126 are formed after the formation of the silicon oxide film 124, a parasitic capacitance can be advantageously reduced in comparison with the formation of the nitride spacers 126 without the silicon oxide film 124. Additionally, the silicon oxide film 124 can reduce the stress generated due to the formation of the silicon nitride film.

The silicon oxide film 124 between the nitride spacers 126 should be removed in a subsequent process. Therefore, the silicon oxide film 124 is preferably formed to have a thin thickness of approximately 100 Å such that exposed portions of silicon oxide film 124 can be easily removed during subsequent rinsing processes.

Figure 3I:
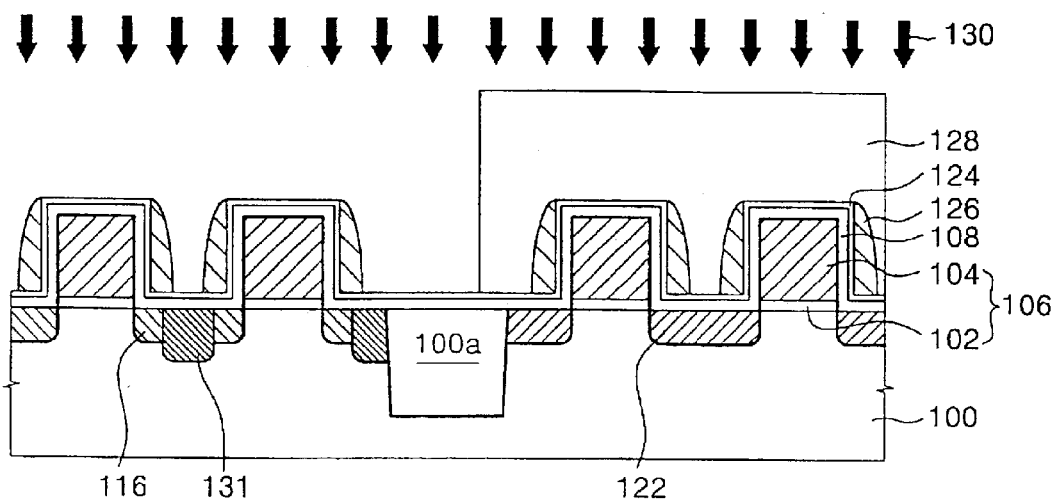

Referring to FIG. 3I, a third mask pattern 128 is formed on the substrate 100 to selectively expose the portion of the substrate 100 where the N-typed transistor is formed after the formation of the nitride spacers 126. Then, impurity ions 130 which are compounds in Group V of the Periodic Table which are implanted into the portion of the substrate 100 where the third mask pattern 128 is positioned. The impurity ions 130 of Group V are only implanted into the portion of the substrate 100 between the nitride spacers 126. The portion of the substrate 100 has relatively a higher impurity concentration after the impurity ions 130 of Group V are implanted. The portion where the impurity ions 130 of Group V are implanted becomes an N+-typed region 131 of the source/drain region.

Subsequently, the rinsing process is executed for removing the third mask pattern 128. During the rinsing process, the silicon oxide film 124 between the nitride spacers 126 is partially removed.

Figure 3J:
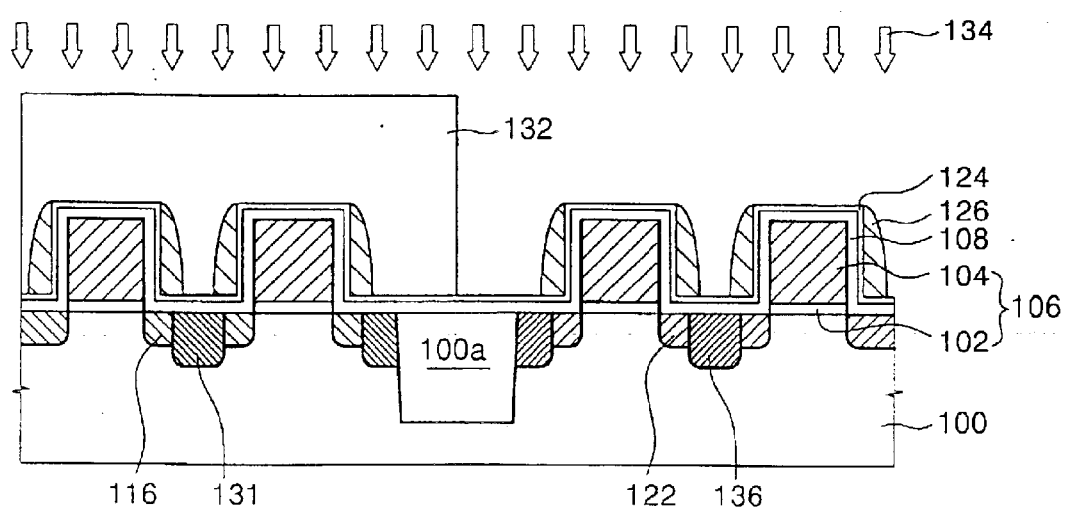

Referring to FIG. 3J, a fourth mask pattern 132 is formed on the substrate 100 to selectively expose the portion of the substrate 100 where the P-typed transistor is formed while the nitride spacers 126 are formed. Then, impurity ions 134 which are compounds included in Group III of the Periodic Table are implanted into the portion of the substrate 100 where the fourth mask pattern 132 is positioned. At that time, the impurity ions 134 of Group III are only implanted into the portion of the substrate 100 between the nitride spacers 126. The portion of the substrate 100 has a relatively higher impurity concentration after the impurity ions 134 of Group III are implanted. The portion where the impurity ions 134 of Group III are implanted becomes a P+-typed region 136 of the source/drain region.

Figure 3K:
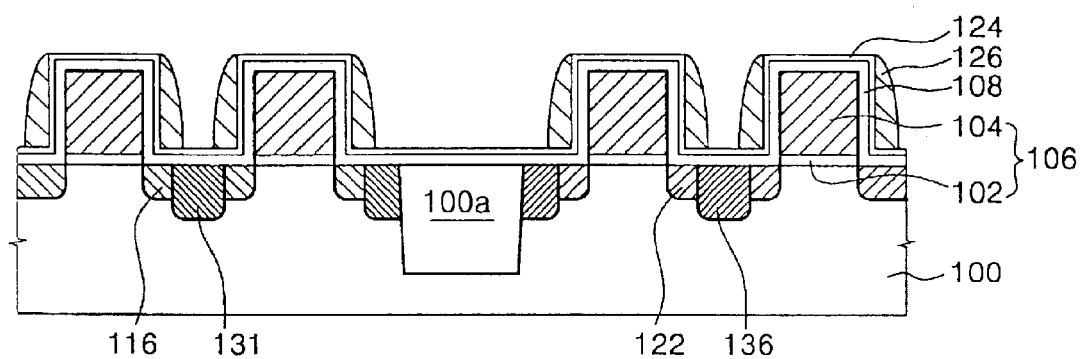

Referring to FIG. 3K, the fourth mask pattern 132 is removed through a rinsing process. The silicon oxide film 124 between the nitride spacers 126 is partially removed during the rinsing process.

According to above-described processes, transistors having LDD structures can be formed on the substrate without the generation of the recesses of the substrate in an N-typed and a P-typed regions of the source/drain region. The transistors having such structures can be advantageously employed in, for example, a SRAM device or a logic device. In addition, the process for manufacturing those transistors can be effectively employed for fabricating the semiconductor device including the transistors in which the length and the interval of gates are very small.

As it is described above, according to an embodiment the present invention, a passivation layer is formed on a substrate before ion implantation processes are executed so that the generation of recesses can be prevented at the portions of the substrate where impurity ions are implanted during rinsing processes. Therefore, failures, such as the resistance increase of a semiconductor device and the characteristic deviations of a transistor in accordance with the depth reduction of the ion-implanted region, can be minimized. As a result, the reliability of a semiconductor device can be enhanced and the yield of a semiconductor manufacturing process can be improved.

Having described the preferred embodiment for manufacturing the transistor, it is noted that modifications and variations can be made by persons skilled in the art in light of the above teachings. It is therefore to be understood that changes may be made in the particular embodiment of the present invention disclosed which is within the scope of the invention outlined by the appended claims.

What is claimed is:

1. A method of forming a metal oxide semiconductor transistor comprising:
   forming a gate electrode on a substrate, the gate electrode including a gate insulation pattern and a conductive pattern;
   forming a re-oxidation film on the gate electrode and on the substrate for curing the gate electrode and the substrate;
   forming a passivation layer on the gate electrode and on the substrate;
   forming a mask pattern for masking a portion of the substrate on which the passivation layer is formed, the unmasked portion forming an exposed portion of the substrate;
   forming a source and drain region by implanting impurity ions into the exposed portion of the substrate;
   cleaning the substrate to at least partially remove the passivation layer and substantially completely removing the mask pattern;
   forming a silicon oxide film on the sidewall of the gate electrode after removing the passivation layer; and
   forming a nitride spacer on the sidewall of the gate electrode on which the silicon oxide film is formed, the nitride spacer acting as a mask for implanting impurities into exposed portions of the substrate.

2. The method of forming a metal oxide semiconductor transistor of claim 1, wherein the passivation layer is substantially completely removed.

3. The method of forming a metal oxide semiconductor transistor of claim 1, wherein a solution which is employed for cleaning the substrate comprises sulfuric acid, a mixture of ammonia and hydrogen peroxide, or a mixture of sulfuric acid, ammonia and hydrogen peroxide.

4. The method of forming a metal oxide semiconductor transistor of claim 1, wherein the passivation layer includes an insulation layer having an etching rate with respect to the rate for cleaning the substrate of less than approximately 1 Å/minute.

5. The method of forming a metal oxide semiconductor transistor of claim 1, wherein the passivation layer has a thickness of approximately 5 to 50 Å.

6. The method of forming a metal oxide semiconductor transistor of claim 1, wherein the passivation layer is formed employing an atomic layer deposition process.

7. The method of forming a metal oxide semiconductor transistor of claim 1, wherein the passivation layer is selected from the group consisting of a silicon nitride layer, a metal oxide layer and a silicon oxide layer.

8. The method of forming a metal oxide semiconductor transistor of claim 1, wherein the re-oxidation film has a thickness of approximately 5 to 50 Å.

9. The method of forming a metal oxide semiconductor transistor of claim 1, wherein the re-oxidation film is selected from the group consisting of a silicon oxide film and a metal oxide film.

10. The method of forming a metal oxide semiconductor transistor of claim 1, wherein the source and the drain regions have depths of about 100 to 500 Å.

11. The method of forming a metal oxide semiconductor transistor of claim 1, wherein the conductive pattern includes a polysilicon layer, a composite of a polysilicon layer and a metal silicide layer, or a composite of a polysilicon layer and a metal layer.

12. A method of forming a metal oxide semiconductor transistor, comprising:
   forming a gate electrode on a substrate the gate electrode including a gate insulation pattern and a conductive pattern;
   forming a passivation layer on the gate electrode and on the substrate;
   forming a mask pattern for masking a portion of the substrate on which the passivation layer is formed, the unmasked portion forming an exposed portion of the substrate;
   forming a source and drain region by implanting impurity ions into the exposed portion of the substrate;
   cleaning the substrate to at least partially remove the passivation layer and substantially completely removing the mask pattern;
   forming a silicon oxide film on a sidewall of the gate electrode after removing said passivation layer;
   forming a nitride spacer on the sidewall of the gate electrode on which the silicon oxide film is formed, the nitride spacer acting as a mask for implanting impurities into exposed portions of the substrate; and
   implanting impurities into the exposed portion of the substrate.

13. The method of forming a metal oxide semiconductor transistor of claim 12, wherein the silicon oxide film includes a middle temperature oxide.

14. The method of forming a metal oxide semiconductor transistor of claim 12, wherein the passivation layer is substantially completely removed.

15. The method of forming a metal oxide semiconductor transistor of claim 12, wherein a solution which is employed for cleaning the substrate comprises sulfuric acid, a mixture of ammonia and hydrogen peroxide, or a mixture of sulfuric acid, ammonia and hydrogen peroxide.

16. The method of forming a metal oxide semiconductor transistor of claim 12, wherein the passivation layer includes an insulation layer having an etching rate with respect to the rate for cleaning the substrate of less than approximately 1 Å/minute.

17. The method of forming a metal oxide semiconductor transistor of claim 12, wherein the passivation layer has a thickness of approximately 5 to 50 Å.

18. The method of forming a metal oxide semiconductor transistor of claim 12, wherein the passivation layer is formed employing an atomic layer deposition process.

19. The method of forming a metal oxide semiconductor transistor of claim 12, wherein the passivation layer is selected from the group consisting of a silicon nitride layer, a metal oxide layer and a silicon oxide layer.

20. The method of forming a metal oxide semiconductor transistor of claim 12, wherein the re-oxidation film has a thickness of approximately 5 to 50 Å.

21. The method of forming a metal oxide semiconductor transistor of claim 12, wherein the re-oxidation film is selected from the group consisting of a silicon oxide film and a metal oxide film.

22. The method of forming a metal oxide semiconductor transistor of claim 12, wherein the source and the drain regions have depths of about 100 to 500 Å.

23. The method of forming a metal oxide semiconductor transistor of claim 12, wherein the conductive pattern includes a polysilicon layer, a composite of a polysilicon layer and a metal silicide layer, or a composite of a polysilicon layer and a metal layer.

24. A method of forming a metal oxide semiconductor transistor comprising:

forming gate electrodes on a substrate, each of the gate electrodes including a gate insulation pattern and a conductive pattern;

forming a passivation layer on the gate electrodes and on the substrate;

forming a first mask pattern on the substrate wherein the first mask pattern selectively opens a first region of the substrate and masks a first covered portion of the substrate including the passivation layer formed thereon;

implanting first impurities into an exposed portion of the first region of the substrate;

etching the substrate so that the first mask pattern is substantially completely removed;

forming a second mask pattern on the substrate wherein the second mask pattern selectively opens a second region of the substrate and masks a second covered portion of the substrate including the passivation layer formed thereon;

implanting second impurities into an exposed portion of the second region of the substrate;

cleaning the substrate so that the passivation layer at least partially remains on the substrate and the second mask pattern is substantially completely removed;

forming a silicon oxide film on the sidewall of the gate electrode after removing the passivation layer; and forming a nitride spacer on the sidewall of the gate electrode on which the silicon oxide film is formed, the nitride spacer acting as a mask for implanting impurities into exposed portions of the substrate.

25. The method of forming a metal oxide semiconductor transistor of claim 24, which further comprises:

forming a silicon oxide film on the substrate prior to implanting said first impurities;

selectively implanting the first impurities into the first region of the substrate; and selectively implanting the second impurities into the second region of the substrate.

26. The method of forming a metal oxide semiconductor transistor of claim 24, wherein the passivation layer includes an insulation layer having an etching rate with respect to a solution employed during the cleaning of the substrate of less than approximately 1 Å/minute.

27. The method of forming a metal oxide semiconductor transistor of claim 24, wherein the passivation layer has a thickness of approximately 5 to 50 Å.

28. The method of forming a metal oxide semiconductor transistor of claim 24, wherein the passivation layer is formed employing an atomic layer deposition process.

29. The method of forming a metal oxide semiconductor transistor of claim 24, wherein the passivation layer is selected from the group consisting of a silicon nitride layer and a metal oxide layer.

30. The method of forming a metal oxide semiconductor transistor of claim 29, wherein the re-oxidation film has a thickness of approximately 5 to 50 Å.

31. The method of forming a metal oxide semiconductor transistor of claim 29, wherein the re-oxidation film is selected from the group consisting of silicon oxide film and a metal oxide film.

32. The method of forming a metal oxide semiconductor transistor of claim 24, further comprising forming a re-oxidation film on the gate electrode and on the substrate for curing the gate electrode and the substrate, wherein the re-oxidation film is formed before forming the passivation layer.

33. The method of forming a metal oxide semiconductor transistor of claim 24, wherein the silicon oxide film includes a middle temperature oxide.

34. A method of forming a metal oxide semiconductor transistor, the method comprising:

forming gate electrodes on a substrate, each of the gate electrodes including a gate insulation pattern and a conductive pattern;

forming a passivation layer on the gate electrodes and on the substrate;

forming a first mask pattern on the substrate wherein the first mask pattern selectively opens a first region of the substrate and masks a first covered portion of the substrate including the passivation layer formed thereon;

implanting first impurities into an exposed portion of the first region of the substrate;

cleaning the substrate so that the first mask pattern is substantially completely removed;

forming a second mask pattern on the substrate wherein the second mask pattern selectively opens a second region of the substrate and masks a second covered portion of the substrate including the passivation layer farmed thereon;

implanting second impurities into an exposed portion of the second region of the substrate;

cleaning the substrate so that the passivation layer at least partially remains on the substrate and the second mask pattern is completely removed;

forming a silicon oxide film on the gate electrodes and on the substrate prior to implanting said first impurities;

forming nitride spacers on sidewalls of the gate electrodes where the silicon oxide film is formed prior to implanting said first impurities;

selectively implanting the first impurities into the first region of the substrate; and selectively implanting the second impurities into the second region of the substrate.

* * * * *